(12) United States Patent
Han et al.

(10) Patent No.: US 11,199,869 B2
(45) Date of Patent: Dec. 14, 2021

(54) METHOD AND APPARATUS FOR OUTPUTTING SIGNALS

(71) Applicant: AGENCY FOR DEFENSE DEVELOPMENT, Daejeon (KR)

(72) Inventors: Jong Pyo Han, Daejeon (KR); Seo Hee Yang, Daejeon (KR); Jae Ho Park, Daejeon (KR)

(73) Assignee: Agency for Defense Development, Daejeon (KR)

(*) Notice: Subject to any disclaimer, the term of this patent is extended or adjusted under 35 U.S.C. 154(b) by 0 days.

(21) Appl. No.: 17/064,866

(22) Filed: Oct. 7, 2020

(65) Prior Publication Data

US 2021/0103311 A1 Apr. 8, 2021

(30) Foreign Application Priority Data

Oct. 7, 2019 (KR) .......................... 10-2019-0123911

(51) Int. Cl.
*G06F 1/10* (2006.01)
*G06F 7/46* (2006.01)

(52) U.S. Cl.
CPC ............... *G06F 1/10* (2013.01); *G06F 7/462* (2013.01)

(58) Field of Classification Search
CPC .................................. G06F 1/10; G06F 7/462
See application file for complete search history.

(56) References Cited

U.S. PATENT DOCUMENTS

| 7,250,781 B2 * | 7/2007 | Nakagawa | G01R 31/281 324/756.05 |
| 10,073,466 B2 * | 9/2018 | Yang | G05D 1/0816 |
| 10,860,052 B2 * | 12/2020 | Gal | H03L 7/0816 |

FOREIGN PATENT DOCUMENTS

JP 01-151307 U 10/1989

* cited by examiner

*Primary Examiner* — Lincoln D Donovan
*Assistant Examiner* — Colleen J O Toole
(74) *Attorney, Agent, or Firm* — Knobbe Martens Olson & Bear LLP

(57) ABSTRACT

This application relates to a method and apparatus for outputting signals. In one aspect, the apparatus includes a signal control unit configured to generate two or more control signals upon two or more conditions, which respectively correspond to the two or more control signals being satisfied. The apparatus also includes a signal output unit configured to output a final output signal depending on the two or more control signals upon an input signal being inputted into the signal output unit.

9 Claims, 4 Drawing Sheets

METHOD AND APPARATUS FOR OUTPUTTING SIGNALS

INCORPORATION BY REFERENCE TO ANY PRIORITY APPLICATIONS

Any and all applications for which a foreign or domestic priority claim is identified in the Application Data Sheet as filed with the present application are hereby incorporated by reference under 37 CFR 1.57.

TECHNICAL FIELD

The present disclosure relates to an apparatus for outputting a signal and a method thereof, and, more specifically, to the apparatus for generating a final output signal for high-level safety and the method, which is performed by the apparatus, of outputting the final output signal.

BACKGROUND

An aviation computer performs controlling mission equipment of an aircraft and regulating the aircraft, and for those purposes the aviation computer transmits and receives various signals. If, among the various signals, a final output signal for performing an operation directly related to safety of aircrafts malfunctions, the malfunction of the final output signal may cause loss of life, property damage, and loss of an aircraft. Accordingly, a design for minimizing possibility of the malfunction of the final output signal is required.

The disclosure of this section is to provide background information relating to the invention. Applicant does not admit that any information contained in this section constitutes prior art.

SUMMARY

The present disclosure provides a signal output apparatus for outputting, without malfunction, a final output signal for high-level safety by generating the final output signal when satisfying a plurality of conditions each set for generating a signal and a method thereof.

In accordance with a first aspect of the present disclosure, there is provided a signal output apparatus including: a signal control unit configured to generate two or more control signals upon two or more conditions, which respectively correspond to the two or more control signals being satisfied; and a signal output unit configured to output a final output signal depending on the two or more control signals upon an input signal being inputted into the signal output unit.

The two or more conditions may include a first condition and a second condition and, the two or more control signals include a first control signal and a second control signal, and wherein the signal control unit includes: a first control signal generating unit configured to generate the first control signal if the first condition is satisfied among a plurality of conditions; a second control signal generating unit configured to generate the second control signal if the second condition is satisfied among the plurality of conditions; a first control signal dividing unit includes: a first dividing circuit configured to divide the first control signal into a first divided signal and a second divided signal; a first inverter connected to the first dividing circuit; and a first buffer connected to the first dividing circuit, wherein, the first divided signal passes through the first inverter and the second divided signal passes through the first buffer; a second control signal dividing unit includes: a second dividing circuit configured to divide the second control signal into a third divided signal and a fourth divided signal; a second inverter connected to the second dividing circuit; and a second buffer connected to the second dividing circuit, wherein, the third divided signal passes through the second inverter and the fourth divided signal passes through the second buffer, a first safety signal output unit configured to output a first safety signal as one of a plurality of the control signals when the first divided signal which is an output of the first inverter and the second divided signal which is an output of the first buffer are different; and a second safety signal output unit configured to output a second safety signal as one of the plurality of the control signals when the third divided signal which is an output of the second inverter and the fourth divided signal which is an output of the second buffer are different.

The signal output unit may include: a first switching unit configured to generate a first output signal from the input signal by performing a switching operation based on the first safety signal; and a second switching unit configured to generate the final output signal from the first output signal by performing a switching operation based on the second safety signal.

The signal control unit may further includes a monitoring unit configured to monitor the first control signal, the second control signal, the first output signal, and the second output signal, and the monitoring unit is further configured to transmit an output restriction signal to at least one of the first control signal generating unit and the second control signal generating unit to prevent the first control signal or the second control signal from being generated when the first output signal or the second output signal is not generated upon the first control signal and the second control signal having been generated or when the first output signal or the second output signal are generated while the first control signal and the second control signal has not been generated.

Each of the first safety signal output unit and the second safety signal output unit may further includes: an open-collector typed inverter component configured to output a logical value of one in a case that the first divided signal, which passed through the first inverter, or the third divided signal, which passed through the second inverter, has a logical value of zero and the second divided signal, which passed through the first buffer, or the fourth divided signal, which passed through the second buffer, has a logical value of one, and to output a logical value of zero under another case that the first divided signal, which passed through the first inverter or the third divided signal, which passed through the second inverter has a logical value of one and the second divided signal, which passed through the first buffer, or the fourth divided signal, which passed through the second buffer, has a logical value of zero; and a discrete output unit configured to transmit the first safety signal or the second safety signal to the first switching unit or the second switching unit when a logical value of one which is output from the open-collector type inverter component is input.

In accordance with a second aspect of the present disclosure, there is provided a signal output method performed by a signal output apparatus, the method including: generating, at a signal control unit, two or more control signals upon two or more conditions, which respectively correspond to the two or more control signals being satisfied; and outputting, at a signal output unit, a final output signal depending on the two or more control signals upon an input signal being inputted into the signal output unit.

In accordance with a third aspect of the present disclosure, there is provided a non-transitory computer-readable storage medium including computer executable instructions, wherein the instructions, when executed by a processor, cause the processor to perform a method, the method including: generating, at a signal control unit, two or more control signals upon two or more conditions, which respectively correspond to the two or more control signals being satisfied; and outputting, at a signal output unit, a final output signal depending on the two or more control signals upon an input signal being inputted into the signal output unit.

According to the one embodiment, by generating the final output signal when satisfying the plurality of the conditions each set for generating the final output signal, the signal output apparatus and the signal output method which output, without malfunction, the final output signal for high-level safety are provided.

In a case where the signal output apparatus and the signal output method according to the one embodiment are applied to a military aviation computer, the final output signal may not be outputted even if a defect in a single component arises. Particularly, there is an additional effect that in a case where the final output signal is controlled by a single programmable device (such as an FPGA, an ASIC (Application Specific Integrated Circuit), etc.) of a signal input-output board in the military aviation computer, the final output signal may not be generated despite a defect forming an all-open situation (where all components are opened) or all-ground situation (where all components are shortened to GND) generally occurring when trouble with the programmable device comes.

Further, there is an additional effect that the final output signal is not generated despite a defect of any single component constituting high-current signal output logic of the military aviation computer for high-level safety and a device therefor.

The safety of military aircrafts may be improved by these effects.

DETAILED DESCRIPTION

The advantages and features of embodiments of the present disclosure and methods of accomplishing them will be clearly understood from the following description of the embodiments taken in conjunction with the accompanying drawings. However, the present disclosure is not limited to those embodiments and is implemented in various forms. It is noted that the embodiments are provided to make a full disclosure and also to allow those skilled in the art to know the full scope of the present disclosure.

In the following description, well-known functions and/or configurations will not be described in detail if they would unnecessarily obscure the features of the disclosure. Further, the terms to be described below are defined in consideration of their functions in the embodiments of the disclosure and vary depending on a user's or operator's intention or practice. Accordingly, the definition is made on a basis of the content throughout the present disclosure.

The terms used herein, including ordinal numbers such as "first" and "second" may be used to describe, and not to limit, various components. The terms simply distinguish the components from one another.

When it is said that a component is "connected" to another component, it should be understood that the former component may be directly connected to the latter component or a third component may be interposed between the two components.

Specific terms used in the present disclosure are used simply to describe specific embodiments without limiting the disclosure. An expression used in the singular encompasses the expression of the plural, unless it has a clearly different meaning in the context.

In an example, to prevent the malfunction of the final output signal for high-level safety in the aviation computer, a method that generates a final output signal when a plurality of conditions are satisfied by adding software providing the conditions for generating the final output signal was frequently used. However, there was a disadvantage that an unintended final output signal may be generated when a physical defect in a single component generating the final output signal has occurred. In addition, if the conditions for generating the final output signal are designed in hardware, the final output signal is generated by a plurality of discrete outputs, through an AND logic gate or an OR logic gate, of an intermediate output component (such as a CPU, an FPGA (Field Programmable Gate Array), etc.) However, if all signals are applied as 1 or 0 because of the physical defect in the intermediate output component, there is a disadvantage that the unintended final output signal is generated.

Figure 1:
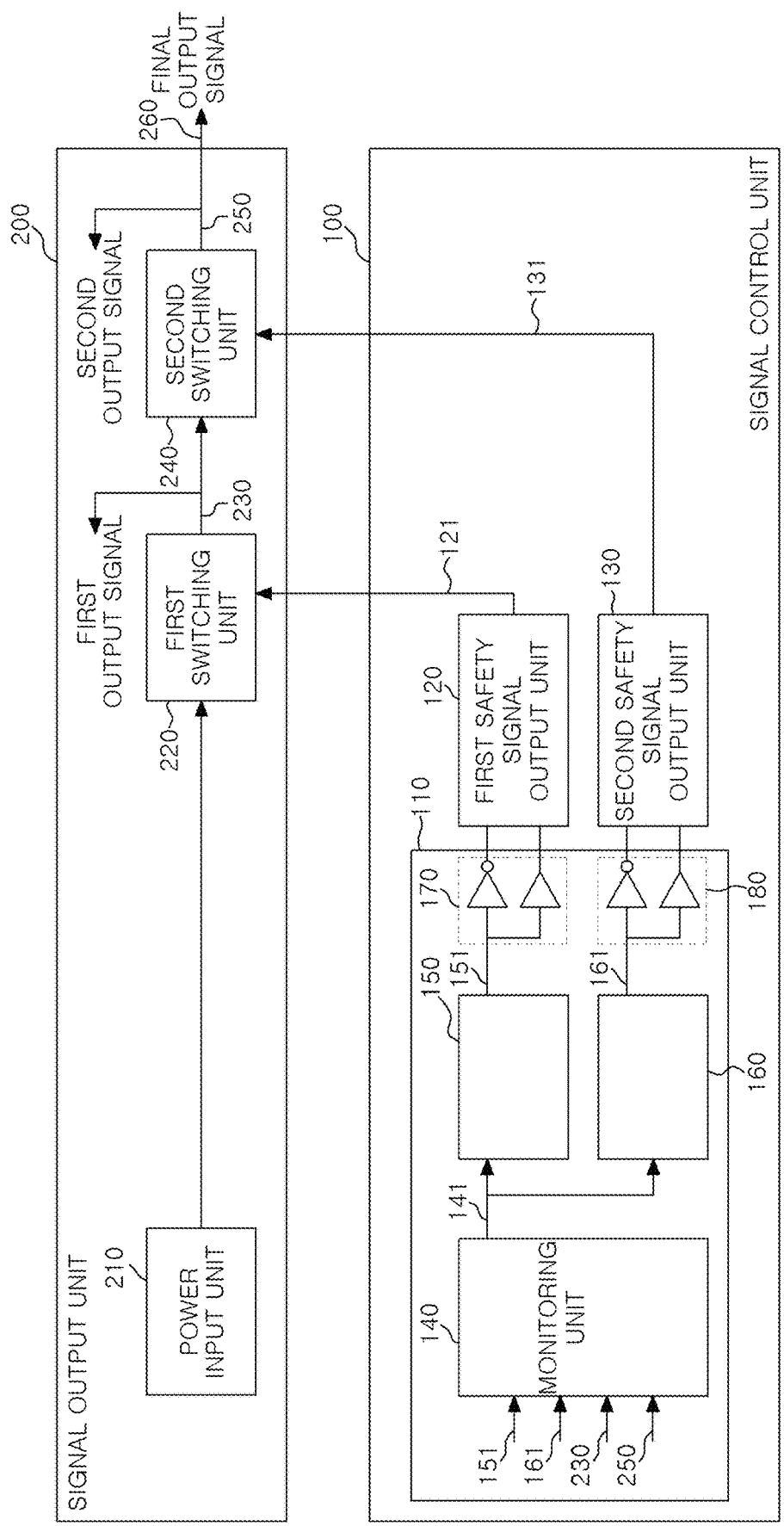
FIG. 1 shows a configuration of a signal output apparatus according to one embodiment of the present disclosure.

FIG. 1 shows a configuration of a signal output apparatus 10 according to one embodiment of the present disclosure.

As illustrated in FIG. 1, the signal output apparatus includes a signal control unit 100 and a signal output unit 200.

The signal control unit 100 generate two or more control signals upon two or more condition, which respectively correspond to the two or more control signals being satisfied.

When a plurality of conditions each set for generating a signal are satisfied, the signal control unit 100 transmits a plurality of control signals to the signal output unit 200.

The signal control unit 100 may include a first safety signal output unit 120, a second safety signal output unit 130, a monitoring unit 140, a first control signal generating unit 150, a second control signal generating unit 160, a first control signal dividing unit 170, and a second control signal dividing unit 180. Among those components, the monitoring unit 140, the first control signal generating unit 150, the second control signal generating unit 160, the first control signal dividing unit 170, and the second control signal dividing unit 180 may be implemented as an FPGA (Field Programmable Gate Array) 110.

The first control signal generating unit 150 generates a first control signal when a first condition among the plurality of the conditions for generating a signal is satisfied.

The second control signal generating unit 160 generates a second control signal when a second condition among the plurality of the conditions for generating a signal is satisfied.

The first control signal dividing unit 170 divides a first condition signal 151 of the first control signal generating unit 150 into first divided signal and second divided signal.

The first control signal dividing unit 170 include first dividing circuit 171, a first inverter 172 and first buffer 173.

First dividing circuit 171 is connected to the first control signal generating unit 150, first inverter 172 and first buffer 173 and configure to divide the first control signal 151 into first divided signal 111 and second divided signal 112. For example, first dividing circuit 171 is configured to be node which is connected to the first control signal generating unit 150, first inverter 172 and first buffer 173.

First inverter 172 is connected to the First dividing circuit 171 and receives the first divided signal 111. First buffer 173 is connected to the First dividing circuit 171 and receives the second divided signal 112.

The first divided signal 111 passes through a first inverter 172 of the first control signal dividing unit 170, and the second divided signal 112 passes through a first buffer 173 of the first control signal dividing unit 170.

The second control signal dividing unit 180 include second dividing circuit 181, a second inverter 182 and second buffer 183.

Second dividing circuit 181 is connected to the second control signal generating unit 160, second inverter 182 and second buffer 183 and configure to divide the second control signal 161 into third divided signal 113 and fourth divided signal 114. For example, second dividing circuit 181 is configured to be node which is connected to the second control signal generating unit 160, second inverter 182 and second buffer 183.

Second inverter 182 is connected to the second dividing circuit 181. Second inverter 182 receives the third divided signal 113. Second buffer 183 is connected to the second dividing circuit 181. Second buffer 183 receives the fourth divided signal 114.

The third divided signal 113 passes through a second inverter 182 of the second control signal dividing unit 180 and the fourth divided signal 114 passes through a second buffer 183 of the second control signal dividing unit 180.

The first safety signal output unit 120 outputs a first safety signal 121 as one of the plurality of control signals when the first divided signal 111 which passed through the first inverter 172 and the second divided signal 112 which passed through the first buffer 173 by the first control signal dividing unit 170 have different logical values.

The second safety signal output unit 130 outputs a second safety signal 131 as one of the plurality of control signals when the third divided signal 113 which passed through the second inverter 182 and the fourth divided signal 114 which passed through the second buffer 183 by the second first control signal dividing unit 180 have different logical values.

The monitoring unit 140 monitors the first control signal 151 of the first control signal generating unit 150, the second control signal 161 of the second control signal generating unit 160, a first output signal 230 of a first switching unit 220, and a second output signal 250 of a second switching unit 240. Further, the monitoring unit 140 transmits an output restriction signal 141 to at least one of the first control signal generating unit 150 and the second control signal generating unit 160 to prevent the first control signal 151 or the second control signal 161 from being generated when the first output signal 230 or the second output signal 250 is not generated though the first control signal 151 and the second control signal 161 are generated, or when the first output signal 230 or the second output signal 250 is generated though the first control signal 151 and the second control signal 161 are not generated.

The signal output unit 200 generates, by using an input power for generating a signal, a final output signal according to the plurality of control signals which are provided by the signal control unit 100. The signal output unit 200 output the final output signal depending on the two or more control signals upon an input being inputted into the signal output unit 200.

The signal output unit 200 may include a power input unit 210 for generating a signal, the first switching unit 220, and the second switching unit 240.

The first switching unit 220 is operated by the first safety signal 121 of the first safety signal output unit 120 and generates the first output signal 230 according to the input power for generating a signal by the power input unit 210 for generating a signal.

The second switching unit 240 is operated by the second safety signal 131 of the second safety signal output unit 130 and generates the second output signal 250 as the single output signal 260 according to the first output signal 230 generated by the first switching unit 220.

Further, the signal control unit 100 may include open-collector type inverter components 300 and 310.

The first open-collector type inverter component 300 includes inverters 301, 302 and 303. The third inverter 301 and fourth inverter 302 of the first open-collector type inverter component 300, included in the first safety signal output unit 120. The fifth inverter 303 of the first open-collector type inverter component 300 included in the second safety signal output unit 130.

The second open-collector type inverter component 310 includes inverters 311, 312 and 313. A sixth inverter 311 of the second open-collector type inverter component 310, included in the first safety signal output unit 120. The seventh inverter 312 and eighth inverter 313 of the second open-collector type inverter component 310 included in the second safety signal output unit 130.

The first divided signal 111 passes through the first inverter 172 of the first control signal dividing unit 170 and the third inverter 301 of the first open-collector type inverter component 300 sequentially.

The second divided signal 112 passes through the first buffer 173 of the first control signal dividing unit 170, the sixth inverter 311 of the second open-collector type inverter component 310 and the fourth inverter 302 of the first open-collector type inverter component 300 sequentially.

The third divided signal 113 passes through the second inverter 182 of the second control signal dividing unit 180 and the seventh inverter 312 of the second open-collector type inverter component 310 sequentially.

The fourth divided signal 114 passes through the second buffer 183 of the second control signal dividing unit 180, the fifth inverter 303 of the first open-collector type inverter component 300 and eighth invertor 313 of the second open-collector type inverter component 310 sequentially.

Figure 2:
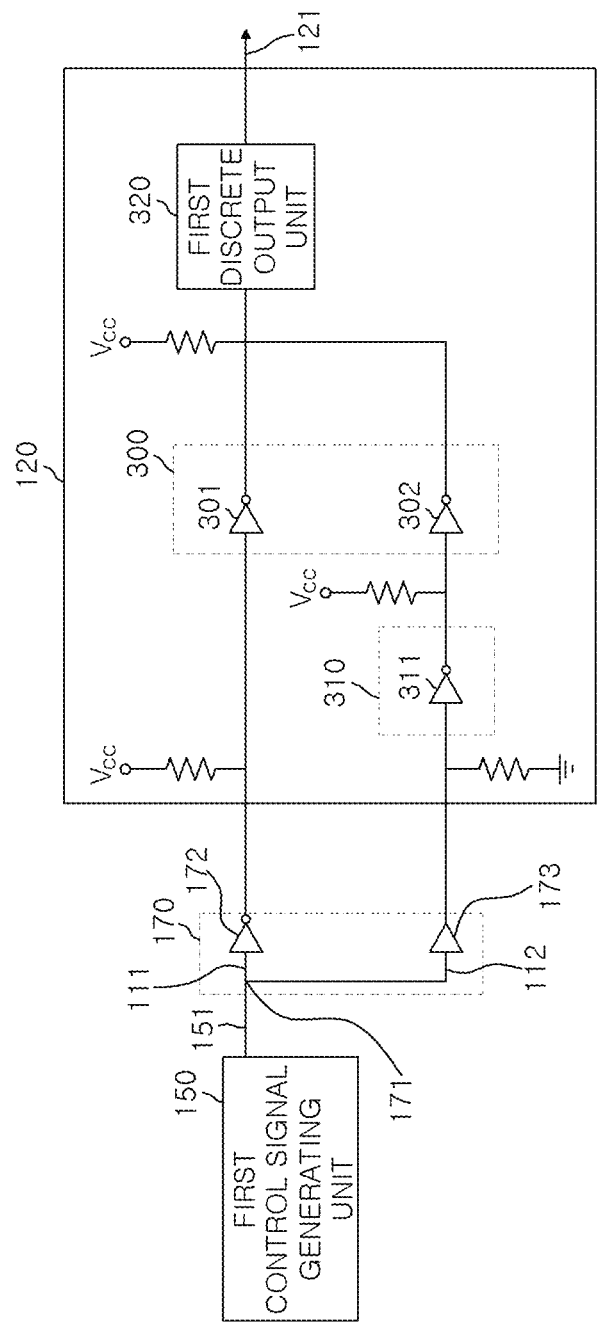
FIG. 2 shows a configuration of the first safety signal output unit included in the signal output apparatus illustrated in FIG. 1.

FIG. 2 shows a configuration of the first safety signal output unit 120 included in the signal output apparatus 10 illustrated in FIG. 1

The third inverter 301 of first open-collector type inverter component 300 outputs first divided signal 111 with logical value of one when the first divided signal 111 which passed through the first inverter 172 of the first control signal dividing unit 170 has logical value of zero. The fourth inverter 302 of first open-collector type inverter component 300 outputs second divided signal 112 with logical value of one when the second divided signal 112 which passed through the first buffer 173 of the first control signal dividing unit 170 has a logical value of one.

In addition, the first safety signal output unit 120 further includes a first discrete output unit 320 which outputs the first safety signal 121 to the first switching unit 220 when the first discrete output unit 320 receives the divided signals with logical values of one from the third inverter 301 and the fourth inverter 302 of first open-collector type inverter component 300.

Figure 3:
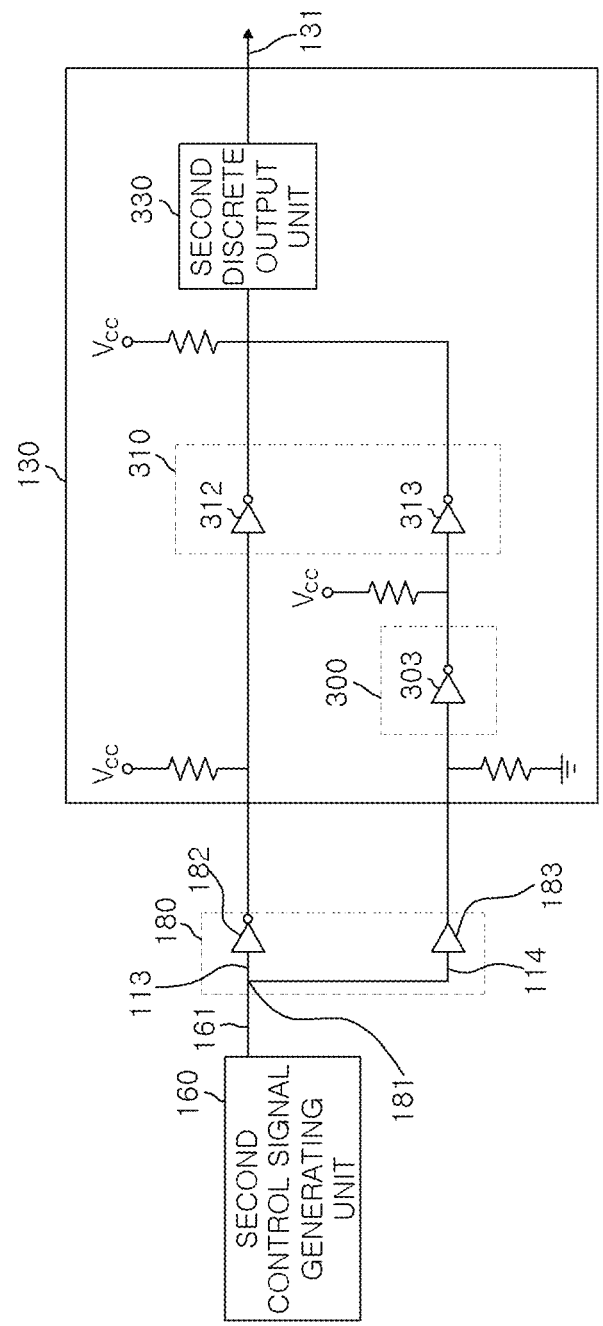
FIG. 3 shows a configuration of the second safety signal output unit included in the signal output apparatus illustrated in FIG. 1.

FIG. 3 shows a configuration of the second safety signal output unit 130 included in the signal output apparatus 10 illustrated in FIG. 1.

The seventh inverter 312 of the second open-collector type inverter component 310 outputs third divided signal 113 with logical value of one when the third divided signal 113 which passed through the second inverter 182 of the second control signal dividing unit 180 has logical value of zero. The eighth inverter 313 of second open-collector type inverter component 310 output fourth divided signal 114 with logical value of one when the fourth divided signal 114 which passed through the second buffer 183 of the second control signal dividing unit 180 has a logical value of one.

In addition, the second safety signal output unit 130 further includes a second discrete output unit 330 which outputs the second safety signal 131 to the second switching unit 240 when the second discrete output unit 330 receives the divided signals with logical values of one from the seventh inverter 312 and the eighth inverter 313 of second open-collector type inverter component 310.

Figure 4:
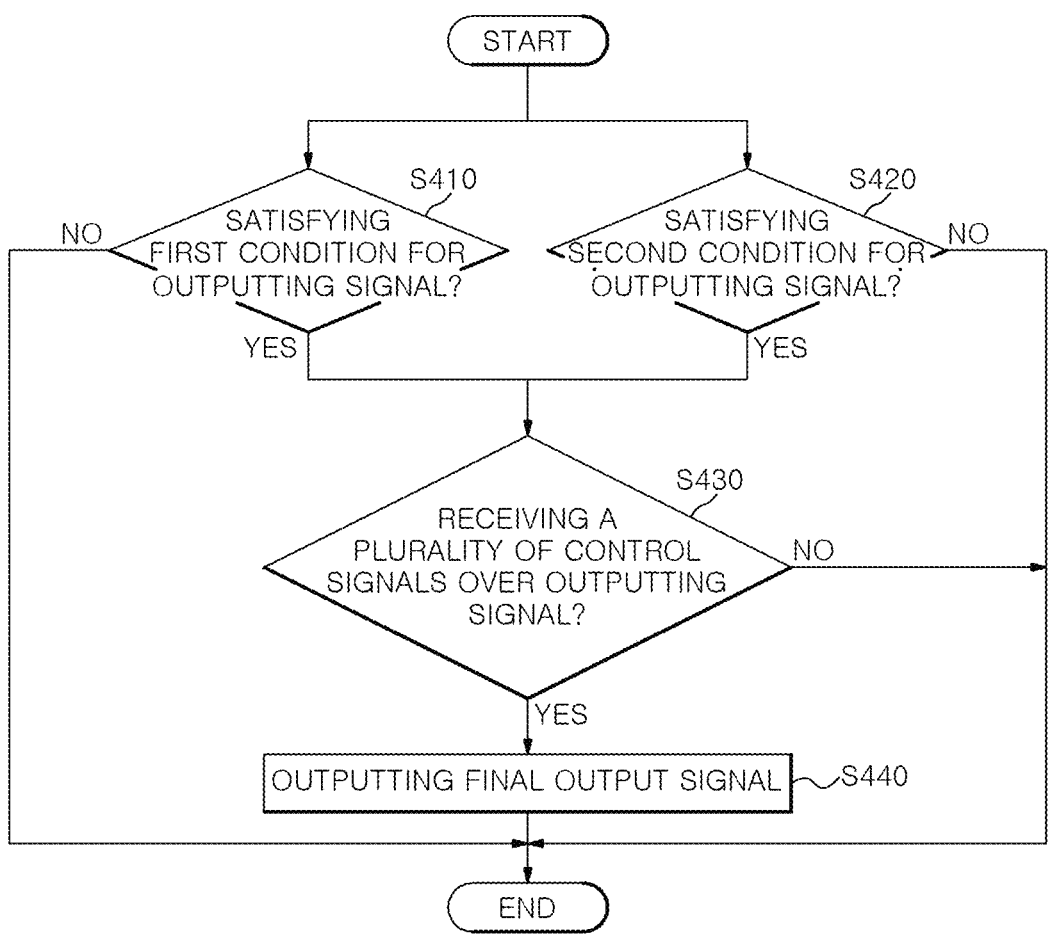
FIG. 4 shows a flowchart illustrating a signal output method performed by a signal output apparatus according to one embodiment of the present disclosure.

FIG. 4 shows a flowchart illustrating a signal output method performed by a signal output apparatus 10 according to one embodiment of the present disclosure.

As illustrated in FIG. 4, the signal output method includes steps S410 and S420 where, when satisfying a plurality of conditions each set for generating a signal, a signal control unit generates each of a plurality of control signals.

In addition, the signal output method further includes steps S430 and S440 where, according to the plurality of control signals, a signal output unit generates a final output signal by using an input power for generating a signal.

Hereinafter, referring to FIGS. 1 to 4, the signal output method performed by the signal output apparatus 10 according to embodiments of the present disclosure will be described in detail.

The FPGA 110 of the signal control unit 100 separately determines, considering safety, two conditions for outputting a signal each of the first control signal generating unit 150 and the second control signal generating unit 160, and causes the signal output unit 200 to generate the final output signal 260 when the condition of the first control signal generating unit 150 and the condition of the second control signal generating unit 160 are satisfied together.

The first control signal 151 of the first control signal generating unit 150 is divided that the first divided signal 111 is input to the first inverter 172 and the second divided signal 112 is input to the first buffer 173. Outputs of the first inverter 172 and the first buffer 173 are input to the first safety signal output unit 120. The first safety signal output unit 120 is a circuit generating and transmitting a request signal, the first safety signal 121, for outputting a signal to the first switching unit 220 when the output of the first inverter 172 has a logical value of zero, and the output of the first buffer 173 has a logical value of one.

The second control signal 161 of the second control signal generating unit 160 is divided that the third divided signal 113 is input to the second inverter 182 and the fourth divided signal 114 is input to the second buffer 183. Outputs of the second inverter 182 and the second buffer 183 are input to the second safety signal output unit 130. The second safety signal output unit 130 is a circuit generating and transmitting a request signal, the second safety signal 131, for outputting a signal to the second switching unit 240 when the output of the second inverter 182 has a logical value of zero, and the output of the second buffer 183 has a logical value of one.

The second safety signal output unit 130 uses open-collector type inverter components 300 and 310 identical to the first safety signal 121 output unit 120 which cause the final output signal 260 not to be generated when a defect forming all-open or all-ground situation in the open-collector type inverter components 300 and 310 arises.

The monitoring unit 140 receives the first control signal 151 and the second control signal 161 each of the first control signal generating unit 150 and the second control signal generating unit 160 which are implemented in the FPGA 110, and a first output signal 230 and a second output signal 250 each of the first switching unit 220 and the second switching unit 240 of the signal output unit 200. By using the received control signals and the received output signals, when the output signals are not input despite the condition signals, or the output signals are input without the control signals, the monitoring unit 140 transmits, to the first control signal generating unit 150 and the second control signal generating unit 160, the output restriction signal 141. The output restriction signal 141 inactivate every output signal to cause the final output signal not to be generated.

Through above logic, the final output signal 260 is not generated even though a defect in the first switching unit 220 or the second switching unit 240 arises.

The first switching unit 220 of the signal output unit 200 receives a power from an aircraft through the power input unit 210 for generating a signal, and transmits first output signal 230 to the second switching unit 240 when receiving the request signal, second safety signal 131, for outputting a signal from the first safety signal output unit 120 of the signal control unit 100. Herein, the first output signal 230 is input to the monitoring unit 140 of the signal control unit 100. The second switching unit 240 of the signal output unit 200 receives the first output signal 230 of the first switching unit 220, and transmits the final output signal 260 to the outside of the signal output unit 200 when receiving the request signal for outputting a signal from the second safety signal output unit 130 of the signal control unit 100. Herein, the first output signal 230 is input to the monitoring unit 140 of the signal control unit 100. The final output signal 260 output from the signal output unit 200 is connected to functions for high-level safety of the aircraft to perform an operation according to an operational concept.

Referring to FIG. 2, the first control signal 151 of the first control signal generating unit 150 implemented in the FPGA 110 of the signal control unit 100 is divided into the first divided signal 111 passes through the first inverter 172 and the second divided signal 112 passes through the first buffer 173. It is designed that when the first divided signal 111 which passed through the first inverter 172 has a logical value of zero and the second divided signal 112 which passed through the first buffer 173 has a logical value of one, the first condition signal 151 causes a logical value of one to be transmitted to the first discrete output unit 320 to transmit the request signal for outputting the first output signal 230 to the first switching unit 220. Particularly, the separate open-collector type inverter components 300 and 310 are used to prevent the final output signal 260 from being generated in a case where a physical defect in the FPGA 110 or a defect in components of the first safety signal output unit 120 arises. Three open-collector type inverters may be installed in each of the open-collector type inverter components 300 and 310. If logical values of the first divided signal 111 which passed through the first inverter 172 and the second divided signal 112 which passed through the first buffer 173 are one because of the physical defect in the FPGA 110, an output of the third inverter 301 of the first open-collector type inverter component 300 is sustained to have a logical value of zero, and thus an output of the first discrete output unit 320 has a logical value of zero regardless of an output of the fourth inverter 302 of the first open-collector type inverter component 300.

Referring to FIG. 3, the second control signal 161 of the second control signal generating unit 160 implemented in the FPGA 110 of the signal control unit 100 is divided into the third divided signal 113 passes through the second inverter 182 and the fourth divided signal 114 passes through the second buffer 183. Herein, the third divided signal 113 which passed through the second inverter 182 is input into seventh inverter 312 and the fourth divided signal 114 which passed through the second buffer 183 is input into fifth inverter 303 and eighth inverter 313 of the second safety signal output unit 130. The inverters 303, 312, and 313 are installed in the open-collector type inverter components 300 and 310 of the second safety signal output unit 130, and the divided signals 113 and 114 are transmitted to the second discrete output unit 330. If logical values of the third divided signal 113 which passed second inverter 182 and the fourth divided signal 114 which passed second buffer 183 are one because of the physical defect in the FPGA 110, an output of the seventh inverter 312 of the second open-collector type inverter component 310 is sustained to have a logical value of zero, and thus an output of the second discrete output unit 330 has a logical value of zero regardless of an output of the eighth inverter 313 of the second open-collector inverter type component 310.

If outputs of the third inverter 301 and the fourth inverter 302 have logical values of one because of a hardware defect in the first open-collector type inverter component 300, an output of the first switching unit 220 is generated regardless of operational intention. However, since the second open-collector type inverter component 310 operates properly, an output of the second switching unit 240 is not generated and thus the final output signal 260 is not generated. Further, if outputs of the seventh inverter 312 and the eighth inverter 313 have logical values of one because of a hardware defect in the second open-collector type inverter component 310, a condition of the second switching unit 240 for generating a second output signal 250 is satisfied. However, an output of the first switching unit 220 is not generated since the first open-collector type inverter component 300 operates properly, and thus the final output signal 260 is not generated. Those defects and states of outputs are continuously monitored by the monitoring unit 140 to inform a user about information on the defects, and if the defect arises, the monitoring unit 140 inactivates output signals 151 and 161 of the first control signal generating unit 150 and the second control signal generating unit 160 to cause the final output signal 260 not to be generated.

As previously described, according to the embodiments of the present disclosure, by generating the final output signal 260 when satisfying the plurality of conditions each set for generating a signal, the signal output apparatus and the signal output method which output, without malfunction, the final output signal 260 for high-level safety are provided.

In a case where the signal output apparatus and the signal output method according to the one embodiment are applied to a military aviation computer, the final output signal 260 may not be outputted even if a defect in a single component arises. Particularly, there is an additional effect that in a case where the final output signal 260 is controlled by a single programmable device (such as an FPGA, an ASIC (Application Specific Integrated Circuit), etc.) of a signal input-output board in the military aviation computer, the final output signal 260 may not be generated despite a defect forming an all-open situation (where all signals are opened) or all-ground situation (where all signals are shortened to GND) generally occurring when trouble with the programmable device comes.

Further, there is an additional effect that the final output signal 260 is not generated despite a defect of any single component constituting high-current signal output logic of the military aviation computer for high-level safety and a device therefor.

The safety of military aircrafts may be improved by these effects.

Combinations of steps in the flowcharts of the present disclosure can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions specified in the steps of the flowchart.

These computer program instructions may also be stored in a computer usable or computer readable memory that can direct a computer or other programmable data processing apparatuses to function in a particular manner, such that the instructions stored in the computer usable or computer readable medium can produce an article of manufacture including instructions which implement the function specified in the steps of the flowcharts.

The computer program instructions may also be loaded onto a computer or other programmable data processing apparatuses to cause a series of operational steps to be performed on the computer or other programmable apparatuses to produce a computer implemented process such that the instructions which execute on the computer or other programmable apparatuses provide processes for implementing the functions specified in the steps of the flowcharts.

Each step in the flowchart may represent a module, segment, or portion of code, which comprises one or more executable instructions for implementing the specified logical function(s). It should also be noted that, in some alternative implementations, the functions noted in the step may occur out of the order noted in the figures. For example, two steps shown in succession may, in fact, be executed substantially concurrently, or the steps may sometimes be executed in the reverse order, depending upon the functionality involved.

The above description is merely example description of the technical scope of the present disclosure, and it will be understood by those skilled in the art that various changes and modifications can be made without departing from original characteristics of the present disclosure. Therefore, the embodiments disclosed in the present disclosure are intended to explain, not to limit, the technical scope of the present disclosure, and the technical scope of the present disclosure is not limited by the embodiments. The protection scope of the present disclosure should be interpreted based on the following claims and it should be appreciated that all technical scopes included within a range equivalent thereto are included in the protection scope of the present disclosure.

What is claimed is:

1. A signal output apparatus comprising:
a signal control unit configured to generate two or more control signals based on two or more conditions, which respectively correspond to the two or more control signals; and
a signal output unit configured to output a final output signal depending on the two or more control signals and based on an input signal being inputted into the signal output unit;
wherein the two or more conditions include a first condition and a second condition, and the two or more control signals include a first control signal and a second control signal, and
wherein the signal control unit includes:
a first control signal generating unit configured to generate the first control signal in response to the first condition being satisfied among a plurality of conditions;
a second control signal generating unit configured to generate the second control signal in response to the second condition being satisfied among the plurality of conditions;
a first control signal dividing unit including:
a first dividing circuit configured to divide the first control signal into a first divided signal and a second divided signal;
a first inverter connected to the first dividing circuit; and
a first buffer connected to the first dividing circuit, wherein the first divided signal is configured to pass through the first inverter and the second divided signal is configured to pass through the first buffer;
a second control signal dividing unit including:
a second dividing circuit configured to divide the second control signal into a third divided signal and a fourth divided signal;
a second inverter connected to the second dividing circuit; and
a second buffer connected to the second dividing circuit,
wherein, the third divided signal is configured to pass through the second inverter and the fourth divided signal is configured to pass through the second buffer;
a first safety signal output unit configured to:
compare the first divided signal which is an output of the first inverter and the second divided signal which is an output of the first buffer, the first divided signal and the second divided signal further configured to respectively pass through a first open-collector type inverter component and a second open-collector type inverter component, the first and the second open-collector type inverter components each including at least one inverter;
determine that the first divided signal and the second divided signal are different after the first divided signal and the second divided signal respectively pass through the first and the second open-collector type inverter components; and
output, by a first discrete output unit of the first safety signal output unit, a first safety signal as one of a plurality of the control signals only when it is determined that the first divided signal and the second divided signal are different; and a second safety signal output unit configured to:
compare the third divided signal which is an output of the second inverter and the fourth divided signal which is an output of the second buffer, the third divided signal and the fourth divided signal further configured to respectively pass through the first and the second open-collector type inverter components;
determine that the third divided signal and the fourth divided signal are different after the third divided signal and the fourth divided signal respectively pass through the first and the second open-collector type inverter components; and
output, by a second discrete output unit of the second safety signal output unit, a second safety signal as one of the plurality of the control signals only when it is determined that the third divided signal and the fourth divided signal are different.

2. The signal output apparatus of claim 1, wherein the signal output unit includes:
a first switching unit configured to generate a first output signal from the input signal by performing a switching operation based on the first safety signal; and
a second switching unit configured to generate the final output signal from the first output signal by performing a switching operation based on the second safety signal.

3. The signal output apparatus of claim 2, wherein the signal control unit further includes a monitoring unit configured to monitor the first control signal, the second control signal, the first output signal, and the final output signal, and
wherein the monitoring unit is further configured to transmit an output restriction signal to at least one of the first control signal generating unit or the second control signal generating unit to prevent the first control signal or the second control signal from being generated (i) when the first output signal or the final output signal is not generated based on the first control signal and the second control signal having been generated or (ii) when the first output signal or the final output signal is generated while the first control signal and the second control signal have not been generated.

4. The signal output apparatus of claim 2, wherein each of the first safety signal output unit and the second safety signal output unit further includes:
the first or the second open-collector type inverter component configured to output a logical value of one in a case that the first divided signal, after passing through the first inverter, or the third divided signal, after passing through the second inverter, has a logical value of zero and the second divided signal, after passing through the first buffer, or the fourth divided signal, after passing through the second buffer, has a logical value of one, and to output a logical value of zero in another case that the first divided signal, after passing through the first inverter or the third divided signal, after passing through the second inverter has a logical value of one and the second divided signal, after passing through the first buffer, or the fourth divided signal, after passing through the second buffer, has a logical value of zero; and
the first or the second discrete output unit configured to transmit the first safety signal or the second safety signal to the first switching unit or the second switching unit when an output from the open-collector type inverter component of a logical value of one is input to the discrete output unit.

5. A method of outputting a signal by a signal output apparatus, the method comprising:

generating, at a signal control unit of the signal output apparatus, two or more control signals based on two or more conditions, which respectively correspond to the two or more control signals; and outputting, at a signal output unit of the signal output apparatus, a final output signal depending on the two or more control signals and based on an input signal being inputted into the signal output unit;

wherein the two or more conditions include a first condition and a second condition, and the two or more control signals include a first control signal and a second control signal, and wherein the signal control unit includes:
- a first control signal generating unit configured to generate the first control signal in response to the first condition being satisfied among a plurality of conditions;
- a second control signal generating unit configured to generate the second control signal in response to the second condition being satisfied among the plurality of conditions;
- a first control signal dividing unit including:
  - a first dividing circuit configured to divide the first control signal into a first divided signal and a second divided signal;
  - a first inverter connected to the first dividing circuit; and
  - a first buffer connected to the first dividing circuit, wherein the first divided signal passes through the first inverter and the second divided signal passes through the first buffer;
- a second control signal dividing unit including:
  - a second dividing circuit configured to divide the second control signal into a third divided signal and a fourth divided signal;
  - a second inverter connected to the second dividing circuit; and
  - a second buffer connected to the second dividing circuit,
  wherein the third divided signal passes through the second inverter and the fourth divided signal passes through the second buffer;
- a first safety signal output unit configured to:
  compare the first divided signal which is an output of the first inverter and the second divided signal which is an output of the first buffer, the first divided signal and the second divided signal further configured to respectively pass through a first open-collector type inverter component and a second open-collector type inverter component, the first and the second open-collector type inverter components each including at least one inverter;
  determine that the first divided signal and the second divided signal are different after the first divided signal and the second divided signal respectively pass through the first and the second open-collector type inverter components; and
  output, by a first discrete output unit of the first safety signal output unit, a first safety signal as one of a plurality of the control signals only when it is determined that the first divided signal and the second divided signal are different; and
- a second safety signal output unit configured to:
  compare the third divided signal which is an output of the second inverter and the fourth divided signal which is an output of the second buffer, the third divided signal and the fourth divided signal further configured to respectively pass through the first and the second open-collector type inverter components;
  determine that the third divided signal and the fourth divided signal are different after the third divided signal and the fourth divided signal respectively pass through the first and the second open-collector type inverter components; and
  output, by a second discrete output unit of the second safety signal output unit, a second safety signal as one of the plurality of the control signals only when it is determined that the third divided signal and the fourth divided signal are different.

6. A non-transitory computer-readable storage medium including computer executable instructions, wherein the instructions, when executed by a processor, cause the processor to:

generate, at a signal control unit of the processor, two or more control signals based on two or more conditions, which respectively correspond to the two or more control signals; and output, at a signal output unit of the processor, a final output signal depending on the two or more control signals and based on an input signal being inputted into the signal output unit;

wherein the two or more conditions include a first condition and a second condition, and the two or more control signals include a first control signal and a second control signal, and wherein the signal control unit includes:
- a first control signal generating unit configured to generate the first control signal in response to the first condition being satisfied among a plurality of conditions;
- a second control signal generating unit configured to generate the second control signal in response to the second condition being satisfied among the plurality of conditions;
- a first control signal dividing unit including:
  - a first dividing circuit configured to divide the first control signal into a first divided signal and a second divided signal;
  - a first inverter connected to the first dividing circuit; and
  - a first buffer connected to the first dividing circuit, wherein the first divided signal is configured to pass through the first inverter and the second divided signal is configured to pass through the first buffer;
- a second control signal dividing unit including:
  - a second dividing circuit configured to divide the second control signal into a third divided signal and a fourth divided signal;
  - a second inverter connected to the second dividing circuit; and
  - a second buffer connected to the second dividing circuit,
  wherein the third divided signal is configured to pass through the second inverter and the fourth divided signal is configured to pass through the second buffer;
- a first safety signal output unit configured to:
  compare the first divided signal which is an output of the first inverter and the second divided signal which is an output of the first buffer, the first divided signal and the second divided signal further configured to respectively pass through a first open-collector type inverter component and a second open-collector type inverter component, the first and the second open-collector type inverter components each including at least one inverter;

determine that the first divided signal and the second divided signal are different after the first divided signal and the second divided signal respectively pass through the first and the second open-collector type inverter components; and output, by a first discrete output unit of the first safety signal output unit, a first safety signal as one of a plurality of the control signals only when it is determined that the first divided signal and the second divided signal are different; and a second safety signal output unit configured to:

compare the third divided signal which is an output of the second inverter and the fourth divided signal which is an output of the second buffer, the third divided signal and the fourth divided signal further configured to respectively pass through the first and the second open-collector type inverter components;

determine that the third divided signal and the fourth divided signal are different after the third divided signal and the fourth divided signal respectively pass through the first and the second open-collector type inverter components; and output, by a second discrete output unit of the second safety signal output unit, a second safety signal as one of the plurality of the control signals only when it is determined that the third divided signal and the fourth divided signal are different.

7. The signal output apparatus of claim 2, wherein the first safety signal output unit is configured to directly provide the first safety signal to the first switching unit of the signal output unit, wherein the second safety signal output unit is configured to directly provide the second safety signal to the second switching unit of the signal output unit, and wherein the first and the second switching units are different from each other.

8. The signal output apparatus of claim 2, wherein the first safety signal output unit is directly connected to the first switching unit of the signal output unit, wherein the second safety signal output unit is directly connected to the second switching unit of the signal output unit, and wherein the first and the second switching units are different from each other.

9. The signal output apparatus of claim 1, wherein the final output signal is configured to be controlled by a single programmable device of a signal input-output board in a military aviation computer.

* * * * *